United States Patent
Chai et al.

(10) Patent No.: US 10,444,581 B2
(45) Date of Patent: Oct. 15, 2019

(54) ARRAY SUBSTRATE BASED ON COLOR FILTER ON ARRAY PROCESS AND DISPLAY DEVICE

(71) Applicant: Shenzhen China Star Optoelectronics Technology Co., Ltd., Shenzhen, Guangdong (CN)

(72) Inventors: Li Chai, Guangdong (CN); Maolin Wang, Guangdong (CN); Xing Lei, Guangdong (CN); Chengcai Dong, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 168 days.

(21) Appl. No.: 15/533,887

(22) PCT Filed: Apr. 10, 2017

(86) PCT No.: PCT/CN2017/079894
§ 371 (c)(1),
(2) Date: Jun. 7, 2017

(87) PCT Pub. No.: WO2018/170957
PCT Pub. Date: Sep. 27, 2018

(65) Prior Publication Data
US 2019/0086747 A1 Mar. 21, 2019

(30) Foreign Application Priority Data

Mar. 20, 2017 (CN) .......................... 2017 1 0166671

(51) Int. Cl.
*G02F 1/133* (2006.01)
*G02F 1/1362* (2006.01)
(Continued)

(52) U.S. Cl.
CPC .. *G02F 1/136227* (2013.01); *G02F 1/133723* (2013.01); *G02F 2001/136222* (2013.01);
(Continued)

(58) Field of Classification Search
CPC ............. G02F 1/133345; G02F 1/1343; G02F 1/133723; G02F 1/136227; G02F 2001/136222
See application file for complete search history.

(56) References Cited

U.S. PATENT DOCUMENTS

2016/0048045 A1* 2/2016 Imai ...................... G02F 1/1337
349/123

* cited by examiner

*Primary Examiner* — Hoai V Pham

(57) ABSTRACT

Provided are a COA array substrate and a display device. The array substrate is provided with a base layer, a metal layer, and a color resist layer from bottom to top. The array substrate is further provided with contact holes passing through the color resist layer and in contact with the metal layer, and the contact holes are arranged so that the alignment film droplets can be distributed when the alignment film droplets drop right onto the contact holes. Air bubbles as in the prior art are thus avoided, thereby preventing a cell gap due to accumulation of an alignment film from becoming larger. Thus, a luminance difference is avoided and the quality of the product is improved without upgrading the existing equipment. The brightness uniformity of the display device is improved by using the array substrate.

5 Claims, 6 Drawing Sheets

(51) Int. Cl.
*G02F 1/1337* (2006.01)
*H01L 27/12* (2006.01)
(52) U.S. Cl.
CPC ........ *G02F 2201/40* (2013.01); *H01L 27/124* (2013.01); *H01L 27/1214* (2013.01)

ARRAY SUBSTRATE BASED ON COLOR FILTER ON ARRAY PROCESS AND DISPLAY DEVICE

CROSS-REFERENCE TO RELATED APPLICATIONS

This application claims the priority of Chinese patent application CN 201710166671.9, entitled "Array Substrate and Display Device" and filed on Mar. 20, 2017, the entirety of which is incorporated herein by reference.

FIELD OF THE INVENTION

The present disclosure relates to the technical field of liquid crystal displays, and in particular, to a COA array substrate and a display device.

BACKGROUND OF THE INVENTION

Thin film transistor liquid crystal display (TFT-LCD) devices have attracted much attention because of their characteristics such as the small size, low power consumption and no radiation. The TFT-LCD devices hold a dominant position in the field of flat displays, and are widely used in all walks of life. A liquid crystal display is usually formed by fitting a color filter substrate and an array substrate together, and in the prior art, a color resist is usually set on the color filter substrate, hence a deviation in the fitting process may cause light leakage. Color filter on array (COA) technology means that a color resist is produced on an array substrate, and the array substrate produced by the technology can effectively reduce light leakage due to the fitting deviation, whereby pixel aperture ratio can be effectively improved.

On a COA array substrate, in order to enable an ITO layer to electrically contact with a metal layer of the array substrate, it is necessary to provide contact holes on a color resist layer so that the metal layer is exposed. Thus, when an ITO layer is fabricated, the metal layer can be electrically contacted with the ITO layer by the contact holes. With diversification of product design, more and more contact holes are provided on the color resist layer. In the process of fabricating a PI alignment film, due to limitations of the existing PI alignment film equipment, that is, the minimum size of PI droplets generated from the existing equipment is 75 ng, when a PI droplet contacts the middle of the contact hole, an air bubble may be formed in the contact hole. FIG. 1a is a cross-sectional view of the prior art when an alignment film droplet drops right onto a contact hole in a B color resist layer. FIG. 1b is a schematic diagram showing positions of contact holes and positions of column-shaped spacers in the prior art when the array substrate is viewed in a normal direction thereof. FIG. 1b shows, from left to right, a red (R) color resist, a green (G) color resist, and a blue (B) color resist in sequence. Each of the three color resists is provided therein with a contact hole 35. A sub spacer generally may not abut against the array substrate, and therefore a projection of the sub spacer on the R color resist layer and the G color resist layer is a projection 15. A column-shaped spacer 63 abuts against the B color resist layer 33. As can be seen from FIGS. 1a and 1b, when a PI droplet 31 drops onto the contact hole 35 formed between the B color resist layer 33 and a metal layer 34, the PI droplet 31 cannot be distributed in the contact hole 35 due to the small size of the contact hole 35, and therefore an air bubble 32 is formed inside the PI droplet 31. As shown in FIG. 2, in a PI prebaking process, the air bubble 32 may expand and burst as temperature increases, causing the PI to accumulate around the contact hole 35, which renders a portion of a PI layer where the PI accumulates thicker than other parts of the PI layer. In a subsequent process for fabricating the column-shaped spacer, when the column-shaped spacer abuts against the thicker portion of the PI layer, it is bound to cause a larger cell gap. As shown in FIG. 3, the column-shaped spacer 63 abuts against a position 64 on the PI layer where the PI is accumulated, causing a gap H to be larger than a gap H' at a normal display area, and thus resulting in a luminance difference and brightness strips.

SUMMARY OF THE INVENTION

In view of the above problems in the prior art, the present disclosure provides a COA array substrate and a display device. It is possible to promote the quality of the product by improving a luminance difference due to accumulation of a PI alignment film without upgrading the existing PI alignment film equipment.

The array substrate of the present disclosure is provided with a base layer, a metal layer, and a color resist layer from bottom to top. The array substrate is further provided with contact holes passing through the color resist layer and in contact with the metal layer. The contact holes are arranged so that the alignment film droplets can be distributed when the alignment film droplets drop right onto the contact holes.

Since when the alignment film droplets drop right onto the contact holes, the alignment film droplets can be distributed, thus no air bubble as in the prior art is formed. The alignment film droplets are uniformly distributed in the contact holes and the surrounding thereof, which prevents a cell gap caused by accumulation of the alignment film from getting larger, so as to avoid the luminance difference and enhance the quality of the product.

As a further improvement to the present disclosure, the contact holes are elliptical in shape when the array substrate is viewed in a normal direction thereof. The shape of the contact hole herein is different from that of the prior as circle or square. The elliptical contact hole has two mutually perpendicular axes, i.e., a major axis and a minor axis. When the alignment film droplet drops right onto the contact hole, although the alignment film droplet cannot be distributed along the minor axis, it can be distributed along the long axis, and be uniformly distributed in the contact hole and its surrounding, to prevent the cell gap caused by accumulation of the alignment film from getting larger and to avoid the luminance difference and enhance the quality of the product.

As a further improvement to the contact hole, the contact hole can also be arranged in a rectangular shape. The rectangular contact hole can have the same technical effect as the elliptical contact hole.

As a further improvement to the present disclosure, the adjacent contact holes are connected to each other when the array substrate is viewed in the normal direction thereof. Such contact holes can still be square or circular as in the prior art, except that adjacent contact holes are connected to each other. When the alignment film droplet drops right onto the contact hole, the alignment film droplet may be distributed in the direction of the adjacent contact hole because the contact hole is connected to the other contact hole, so that the alignment film is uniformly distributed in the contact holes and the surrounding thereof.

As a further improvement to the present disclosure, the contact holes are circular in shape when the array substrate is viewed in the normal direction thereof, and the adjacent contact holes are connected by grooves. Or, the contact holes are square in shape, and the adjacent contact holes are connected by grooves.

The adjacent contact holes are connected by grooves, and the alignment film droplets dropping onto the contact holes are distributed along grooves and are uniformly distributed around the contact holes and the grooves.

As a further improvement to the array substrate of the present disclosure, the array substrate further includes an alignment film provided on the color resist layer. The alignment film droplets at the contact holes spread and are uniformly distributed so that the entire alignment film can be uniformly distributed on the color resist layer, so as to prevent the cell gap difference caused by accumulation of the alignment film and to avoid the luminance difference.

Further, the composition of the alignment film comprises a polyimide resin. The polyimide resin is a commonly used alignment film material, and it is easy to get.

The present disclosure further provides a display device comprising a first substrate and a second substrate disposed opposite to each other, and the first substrate is the array substrate described above. The array substrate is provided with a base layer, a metal layer, and a color resist layer from bottom to top, and the array substrate is further provided with contact holes which pass through the color resist layer and contact with the metal layer. The contact holes are arranged so that the alignment film droplets can be distributed when the alignment film droplets drops right onto the contact holes. Thus, the cell gap difference caused by accumulation of the alignment film is avoided and the brightness uniformity of the display device is improved.

In summary, the array substrate provided by the present disclosure can enable the alignment film droplets dropping right onto the contact holes to spread and be uniformly distributed at the contact holes and the surrounding thereof by improving the structure of the contact holes without upgrading the existing alignment film equipment. Thus, the cell gap difference caused by accumulation of the alignment film is avoided and the brightness uniformity of the display device using the array substrate is improved.

BRIEF DESCRIPTION OF THE DRAWINGS

The present disclosure will be described in a more detailed way below based on embodiments and with reference to the accompanying drawings, in which.

Figure 1A:
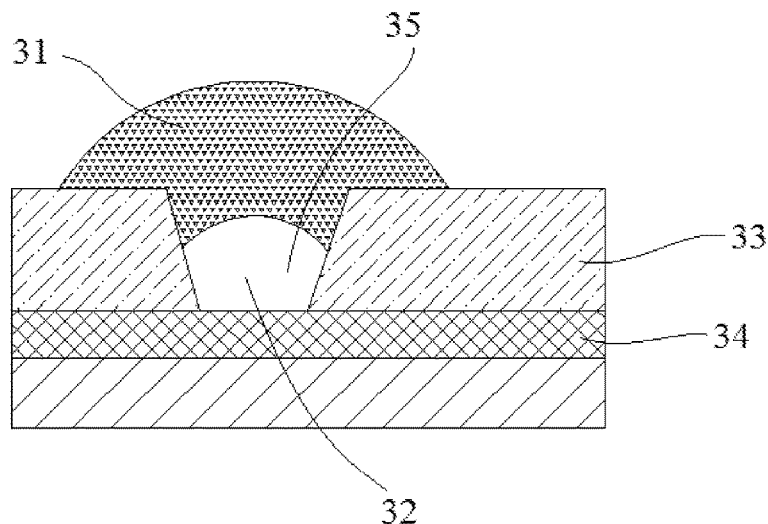
FIG. 1a schematically shows a cross-sectional view when an alignment film droplet drop onto a contact hole in a B color resist layer in the prior art.
Figure 1B:
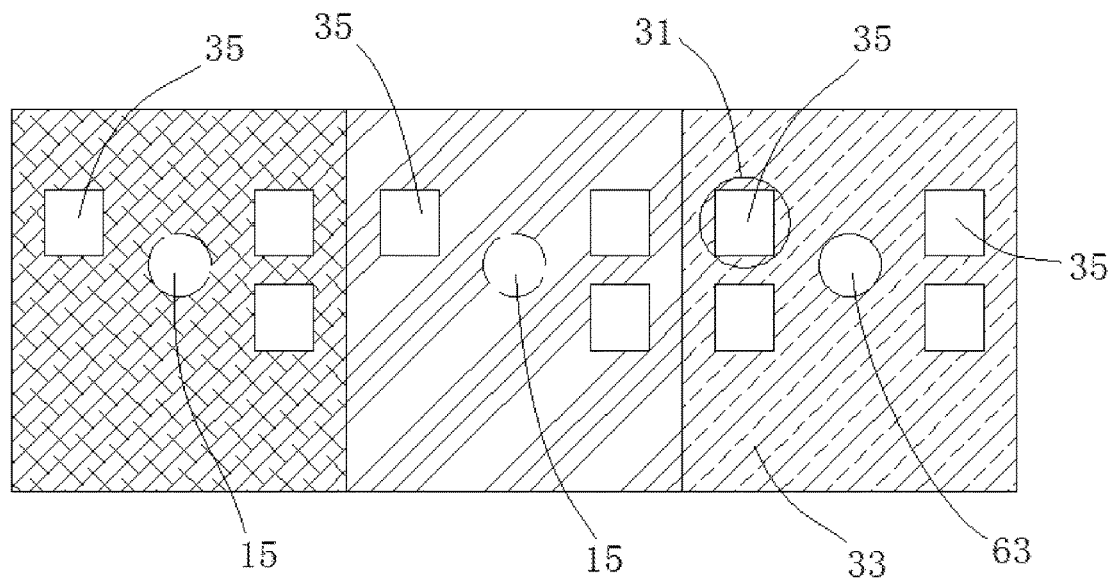
FIG. 1b schematically shows positions of contact holes and a position of an spacer when viewed along a normal direction of an array substrate in the prior art.
Figure 2:
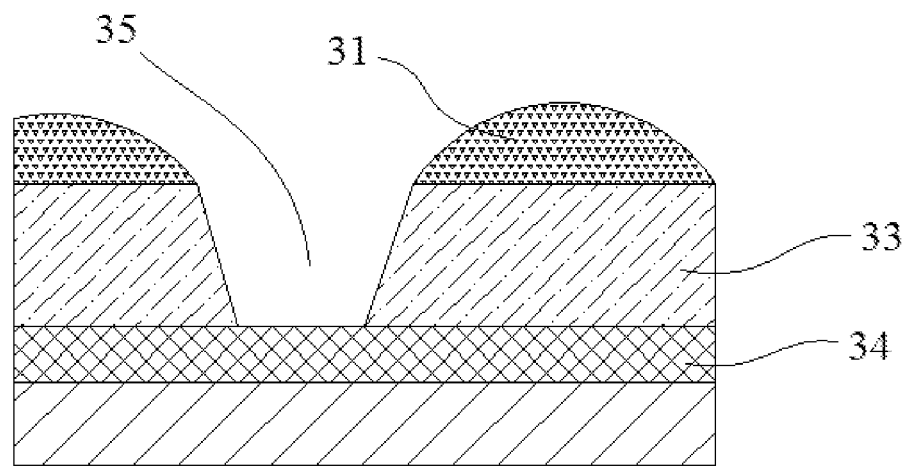
FIG. 2 schematically shows accumulation of alignment film liquid around the contact hole after burst of an air bubble.
Figure 3:
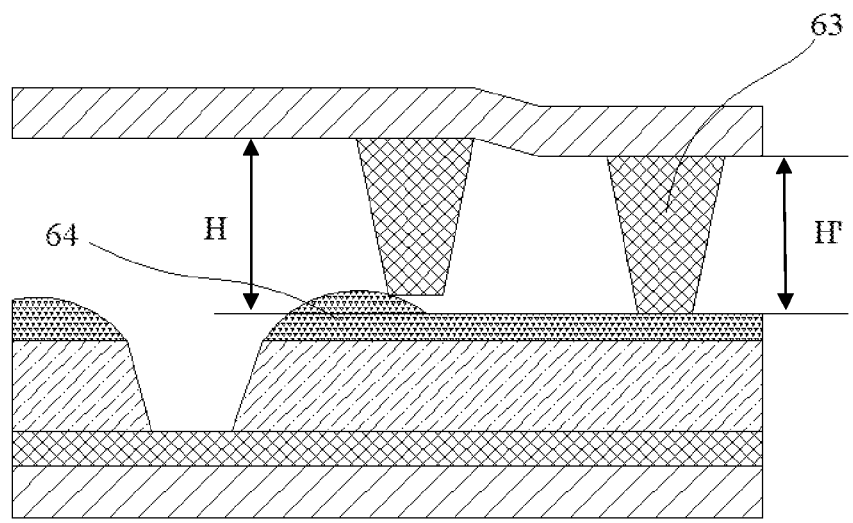
FIG. 3 schematically shows a structure when a column-shaped spacer piles up to a position where alignment film liquid accumulates.

In the accompanying drawings, same components use same reference signs. The accompanying drawings are not drawn according to actual proportions

DETAILED DESCRIPTION OF THE EMBODIMENTS

The present disclosure will be explained in detail below with reference to the accompanying drawings. The "upper", "lower", "left", and "right" in the following are in relation to the drawing direction and should not be construed for limiting the present disclosure.

Figure 4:
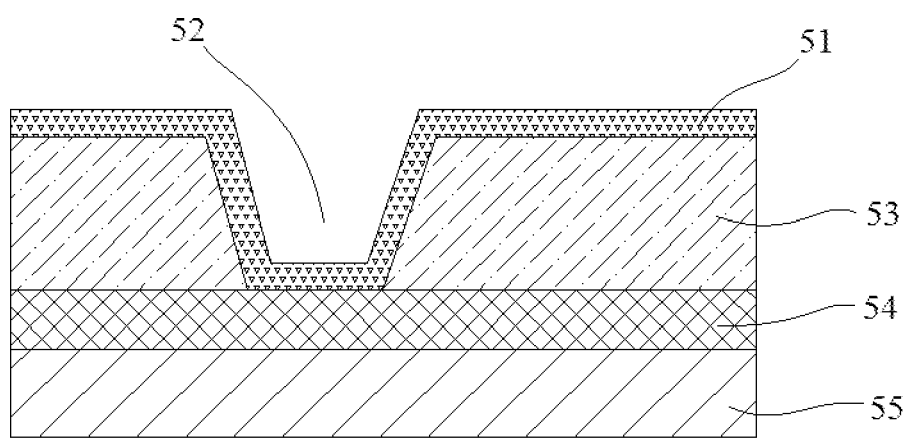
FIG. 4 schematically shows a sectional structure of the contact hole on the array substrate of the present disclosure.

FIG. 4 shows an array substrate of the present disclosure, and the array substrate is provided with a base layer 55, a metal layer 54, and a color resist layer 53 from bottom to top. In order to enable an ITO layer to be electrically connected to the metal layer 54, the array substrate is further provided with a contact hole 52 passing through the color resist layer 53 and in contact with the metal layer 54. In order to prevent air bubbles generated because the alignment film droplets dropping right onto the contact hole 52 cannot be distributed, the contact hole 52 on the array substrate of the present disclosure is arranged so that the alignment film droplets can be distributed when the alignment film droplets drop right onto the contact hole 52. As shown in FIG. 4, the spread alignment film droplets cause the alignment film 51 to be uniformly distributed on the contact hole 52 and the surrounding thereof to avoid accumulation of the alignment film.

The specific structure of the contact hole 52 in B color resist layer will be explained below. It is to be noted that the contact hole 52 is provided not only in the B color resist layer but also in other color resist layers. In addition, in the following embodiments, only the distribution of the contact hole 52 is provided for detailing the present disclosure. The specific distribution of the contact hole 52 can be determined according to actual needs.

Embodiment 1

Figure 5:
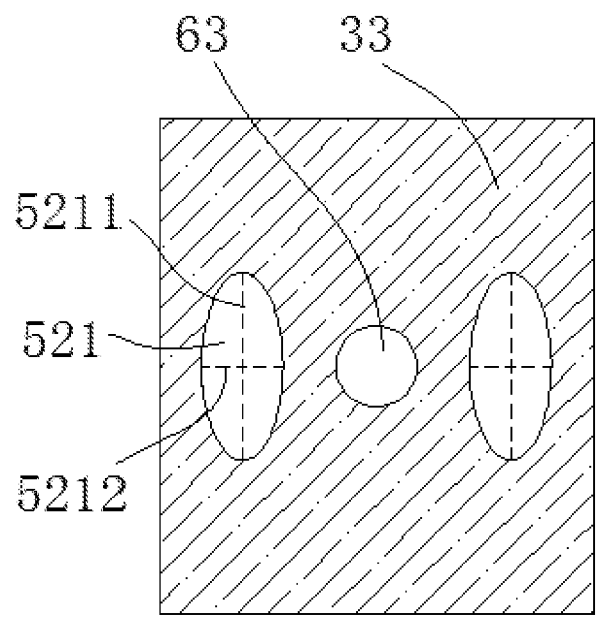
FIG. 5 schematically shows a shape of the contact hole in the Embodiment 1 when viewed along the normal direction of the array substrate.

FIG. 5 schematically shows a shape of a contact hole 521 in a B color resist layer 33 in the present embodiment when an array substrate is viewed along a normal direction thereof. In the present embodiment, the contact hole 521 is elliptical in shape, and the contact hole 521 has a major axis 5211 and a minor axis 5212. When an alignment film droplet drops over the contact hole 521, the alignment film droplet cannot be distributed along the minor axis 5212, but it can be distributed along the major axis 5211. Because the alignment film droplet is distributed along the major axis 5211, an air bubble within the alignment film droplet thus is avoided. Meanwhile the spread alignment film droplet is uniformly distributed at the contact hole and the surrounding thereof, so as not to result in accumulation of the alignment film, thereby preventing a cell gap caused by accumulation of the alignment film from getting larger and avoiding a luminance difference.

Embodiment 2

Figure 6:
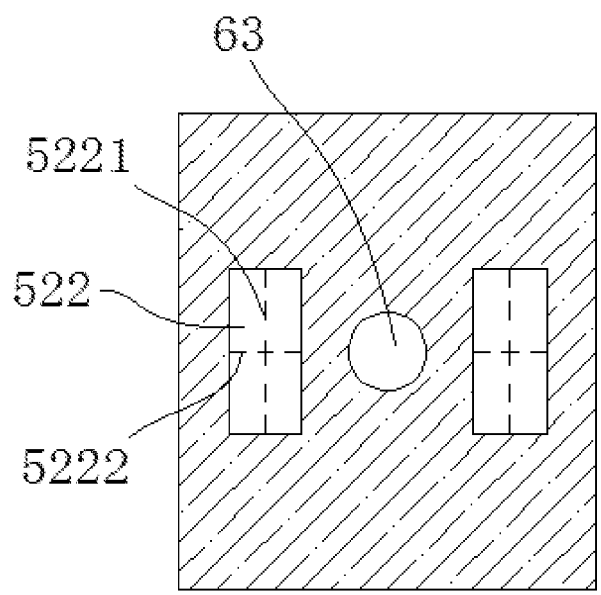
FIG. 6 schematically shows the shape of the contact hole in the Embodiment 2 when viewed along the normal direction of the array substrate.

FIG. 6 schematically shows a shape of a contact hole 522 in a B color resist layer in the present embodiment when an array substrate is viewed along a normal direction thereof. In the present embodiment, the contact hole 522 is rectangular in shape. Similar to the Embodiment 1, the contact hole 522 also has a major axis 5211 and a minor axis 5212. An alignment film droplet can be distributed along the long axis 5221, to achieve the same effect with the Embodiment 1. Of course, in order to facilitate the formation of the contact hole 522, the contact hole 522 may be provided with rounded corners according to needs.

Embodiment 3

Figure 7:
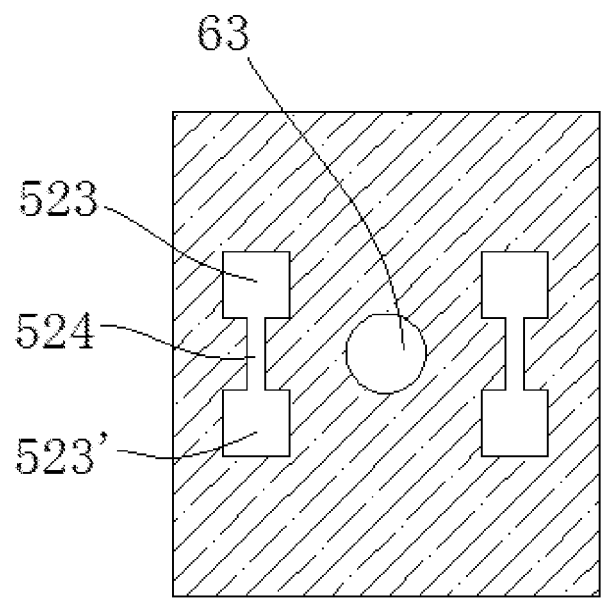
FIG. 7 schematically shows the shape of the contact hole in the Embodiment 3 when viewed along the normal direction of the array substrate.

FIG. 7 schematically shows a structure of a contact hole 523 of the present embodiment. In the present embodiment, the contact hole 523 is the same as the contact hole in the prior art, except that the adjacent contact holes 523 are connected to each other. As shown in FIG. 7, the contact hole 523 is connected with an adjacent contact hole 523' by a groove 524. When an alignment film droplet drops right onto the contact hole 523, although the alignment film droplet cannot be distributed in the circumferential direction of the contact hole 523, the alignment film droplet may be distributed toward the contact hole 523' along the groove 524 due to the arrangement of the groove 524, so that the alignment film droplet spreads and are distributed uniformly around the contact hole 523 and the groove 524.

The contact hole can be round or square, or in other specific shapes.

Embodiment 4

Figure 8:
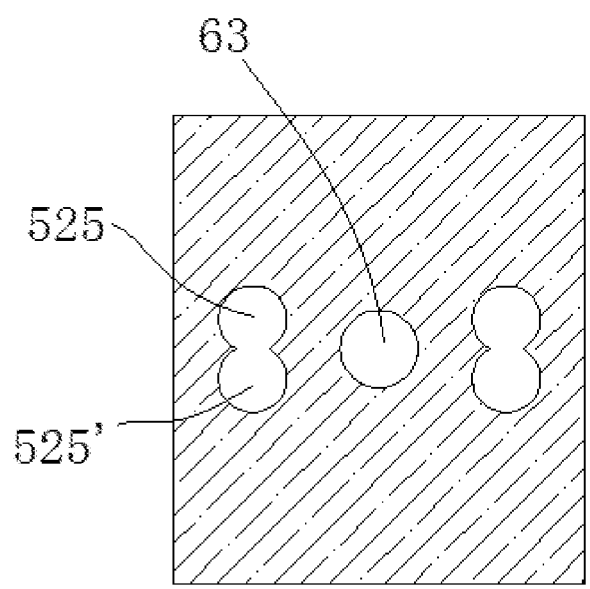
FIG. 8 schematically shows the shape of the contact hole in the Embodiment 4 when viewed along the normal direction of the array substrate.

FIG. 8 schematically shows a structure of a contact hole 525 of the present embodiment. In the present embodiment, the contact hole 525 is circular in shape. The contact hole 525 and the other adjacent contact hole 525' are connected to and intersect each other, so that a length of the contact hole in an intersecting direction is increased. Thus, an alignment film droplet dropping right onto the contact hole 525 can spread into a contact hole 525' so as to be uniformly distributed around the contact hole 525 and the contact hole 525'.

Of course, the intersecting contact holes may also be of other similar shapes, such as hexagon.

Embodiment 5

Figure 9:
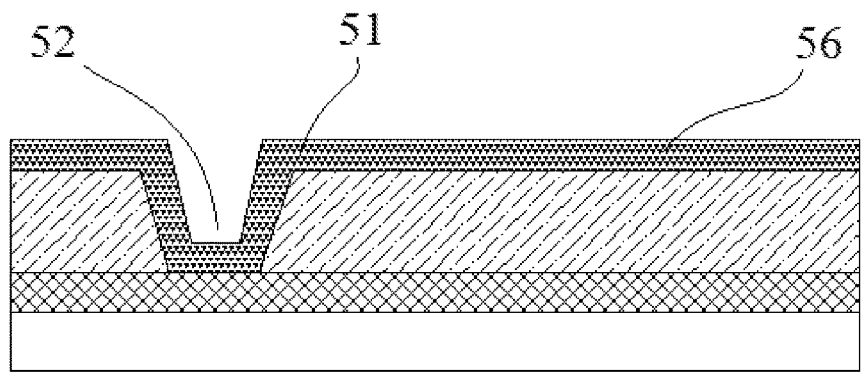
FIG. 9 schematically shows a sectional structure of the array substrate of the present disclosure.

For an array substrate in the present Embodiment, a contact hole has a structure as of any one of the Embodiment 1, the Embodiment 2, the Embodiment 3, or the Embodiment 4, so that when an alignment film droplet drops right onto the contact hole, the alignment film droplet can spread and be uniformly distributed around the contact hole. As shown in FIG. 9, in the array substrate of the present embodiment, an alignment film 56 is further provided over a color resist layer, and the alignment film covers the entire array substrate. Because an alignment film 51 is uniformly distributed at a contact hole 52 and its surrounding, the integrated alignment film 56 is also uniformly distributed in thickness. Preferably, the composition of the alignment film comprises a polyimide resin.

Embodiment 6

Figure 10:
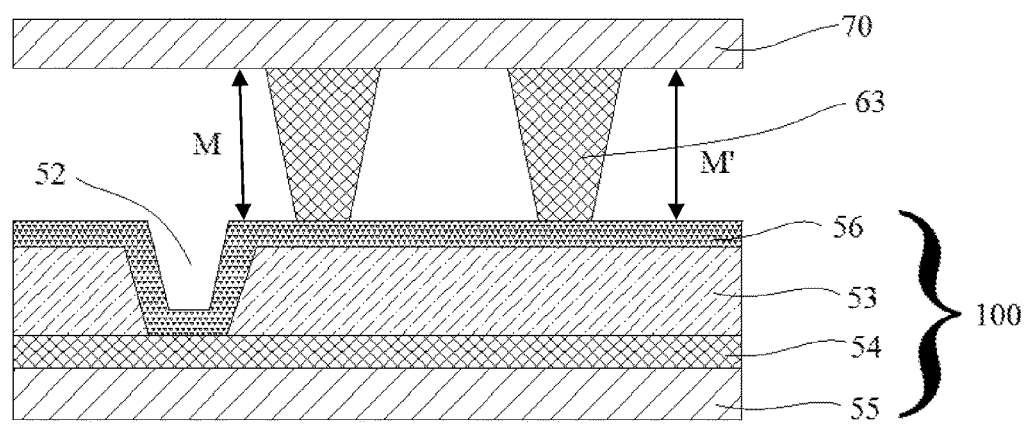
FIG. 10 schematically shows a sectional structure of a display device of the present disclosure.

FIG. 10 schematically shows a structure of a display device of the present disclosure. The display device comprises a first substrate 100 and a second substrate 70 disposed opposite to each other, and a column-shaped spacer 63 is provided between the first substrate 100 and the second substrate 70. The first substrate is the array substrate provided by the present disclosure. The first array substrate 100 is provided with a base layer 55, a metal layer 54, and a color resist layer 53 from bottom to top. Moreover, an alignment film 56 is provided above the color resist layer 53. Since the alignment film is uniformly distributed at the contact hole 52 and its surrounding on the first substrate 100, a cell gap M around the contact hole 52 is equal to a cell gap M' of the normal display area so as to avoid a luminance difference due to a cell gap difference and improve the brightness uniformity of the display device.

It should be clarified that the above embodiments are described only for better understanding, rather than restricting the present disclosure. Although the present disclosure is described in a detailed way with reference to the preferable embodiments, it should be understood that any person skilled in the art can make amendments and equivalent substitutes to the technical solutions of the present disclosure without departing from the spirit and scope of the present disclosure, and the amendments and substitutes shall be covered by the scope as defined in the claims of the present disclosure

The invention claimed is:

1. An array substrate, provided with a base layer, a metal layer, and a color resist layer from bottom to top, wherein the array substrate is further provided with contact holes passing through the color resist layer and in contact with the metal layer, and the contact holes are elliptical in shape when the array substrate is viewed in a normal direction thereof, so that alignment film droplets are uniformly distributed at the contact holes and the surrounding thereof when the alignment film droplets drop over the contact holes.

2. The array substrate according to claim 1, wherein the array substrate further comprises an alignment film provided over the color resist layer.

3. The array substrate according to claim 2, wherein the composition of the alignment film comprises a polyimide resin.

4. A display device, wherein the display device comprises a first substrate and a second substrate disposed opposite to each other, and the first substrate is an array substrate; and
the array substrate is provided with a base layer, a metal layer, and a color resist layer from bottom to top; the array substrate is further provided with contact holes passing through the color resist layer and in contact with the metal layer; and the contact holes are elliptical in shape when the array substrate is viewed in a normal direction thereof, so that alignment film are uniformly distributed at the contact holes and the surrounding thereof when the alignment film droplets drop over the contact holes.

5. The display device according to claim 4, wherein the array substrate further comprises an alignment film provided over the color resist layer.

\* \* \* \* \*